United States Patent [19]

Babano

[11] Patent Number: 4,598,258
[45] Date of Patent: Jul. 1, 1986

[54] CIRCUIT ARRANGEMENT COMPRISING A VOLTAGE-CONTROLLED OSCILLATOR OPERABLE WITH DIFFERENT SENSITIVITIES

[75] Inventor: Sotoaki Babano, Tokyo, Japan

[73] Assignee: NEC Corporation, Tokyo, Japan

[21] Appl. No.: 748,234

[22] Filed: Jun. 24, 1985

[30] Foreign Application Priority Data

Jun. 25, 1984 [JP] Japan .................. 59-130749

[51] Int. Cl.$^4$ .............................................. H03L 7/06
[52] U.S. Cl. ..................................... 331/14; 331/185; 455/343
[58] Field of Search .................. 331/14, 17, 18, 25, 331/185; 455/218, 265, 343; 375/120

[56] References Cited

FOREIGN PATENT DOCUMENTS 0051774  5/1982  European Pat. Off. ............. 331/185

Primary Examiner—Eugene R. LaRoche
Assistant Examiner—Robert J. Pascal
Attorney, Agent, or Firm—Laff, Whitesel, Conte & Saret

[57] ABSTRACT

In a circuit arrangement comprising a power source circuit (12) and a phase detector (22), a phase difference signal (PD) is supplied to a first switch (31) repeatedly turned on and off during battery saving operation and to a second switch (32) initially turned on simultaneously with the first switch. First and second intermediate signals are sent through first and second low-pass filters (41, 42; 43, 44) as first and second modified signals ($MO_1$ and $MO_2$), respectively, to a voltage-controlled oscillator (25). A bidirectional nonlinear circuit (36, 37) becomes conductive and also sends the second modified signal to the voltage-controlled oscillator when the first intermediate signal becomes high. The voltage-controlled oscillator produces an oscillation signal with a high sensitivity on supply of both the first and the second modified signals and with a low sensitivity on sole supply of the first modified signal. Such different sensitivities serve to make the circuit arrangement rapidly and stably carry out the battery saving operation.

3 Claims, 5 Drawing Figures

CIRCUIT ARRANGEMENT COMPRISING A VOLTAGE-CONTROLLED OSCILLATOR OPERABLE WITH DIFFERENT SENSITIVITIES

BACKGROUND OF THE INVENTION

This invention relates to a circuit arrangement for carrying out battery saving operation and, in particular, to a circuit arrangement for use in a radio receiver, such as a portable receiver, driven by a battery.

A portable receiver often comprises a phase-locked loop circuit which will be called a synthesizer hereinunder. As known in the art, such a synthesizer can be used as a local oscillation circuit and comprises a voltage-controlled oscillator, a phase detector, and a reference oscillator. In a portable receiver of the type described, it is preferable that battery saving operation can be carried out during a waiting or standby operation for a call so as to save electric power consumption. However, existence of the synthesizer makes it difficult to carry out the battery saving operation. More particularly, let the synthesizer be repeatedly put in an intermittent active state and an intermittent inactive state during the battery saving operation. In this event, the synthesizer should be locked within the intermittent active state. Otherwise, the portable receiver would be wrongly operated. However, a long time must inevitably be wasted so as to put the synthesizer in a locked state in a usual manner.

A conventional circuit arrangement is proposed which comprises a synthesizer operable in cooperation with a power source circuit and a control circuit for controlling the power source circuit to make the synthesizer carry out the battery saving operation. More specifically, a continuous source voltage is supplied from the power source circuit to a voltage-controlled oscillator of the synthesizer during the battery saving operation while an intermittent source voltage is delivered to the remaining elements, such as a reference oscillator and a phase detector, under control of the control circuit during the battery saving operation. As a result, the phase detector is intermittently operated to intermittently detect a phase difference between a reference signal and an oscillation signal which are given from the reference oscillator and the voltage-controlled oscillator, respectively.

With this structure, the phase difference may widely be varied each time when the phase detector is intermittently energized by the intermittent source voltage. Such a wide variation of the phase difference results in an excessive fluctuation of the oscillation signal.

SUMMARY OF THE INVENTION

It is an object of this invention to provide a circuit arrangement which is capable of rapidly carrying out battery saving operation.

It is another object of this invention to provide a circuit arrangement of the type described, wherein a voltage controlled oscillator can be controlled without an excessive fluctuation of an oscillation signal.

A circuit arrangement to which this invention is applicable is for carrying out a battery saving operation. The circuit arrangement comprises voltage producing means for producing during the battery saving operation a continuous and an intermittent source voltage with the intermittent source voltage made to alternatingly define an active and an inactive interval, phase difference detecting means energized during the active interval for detecting a phase difference between a reference and a local signal to produce a phase difference signal of a variable level corresponding to the phase difference, signal modifying means for modifying the phase difference signal into a modified signal which lasts continuously even during the inactive interval, oscillation generating means energized by the continuous source voltage and responsive to the modified signal for generating an oscillation signal of an oscillation frequency dependent on the modified signal, and supplying means for supplying the phase difference detecting means with the oscillation signal as the local signal. According to this invention, the signal modifying means comprises signal dividing means energized during the active interval for dividing the phase difference signal into a first and a second intermediate signal which have the variable level in common and signal producing means responsive to the first and the second intermediate signals for producing the modified signal with division into a first and a second modified signal. The oscillation generating means comprises circuit constant providing means having a first and a second circuit constant and responsive to the first and the second modified signals for providing the first and the second circuit constants, respectively, and an oscillator energized by the continuous source voltage and coupled to the circuit constant providing means for generating the oscillation signal with the oscillation frequency decided by one of the first and the second circuit constants.

DESCRIPTION OF THE PREFERRED EMBODIMENT

Figure 1:
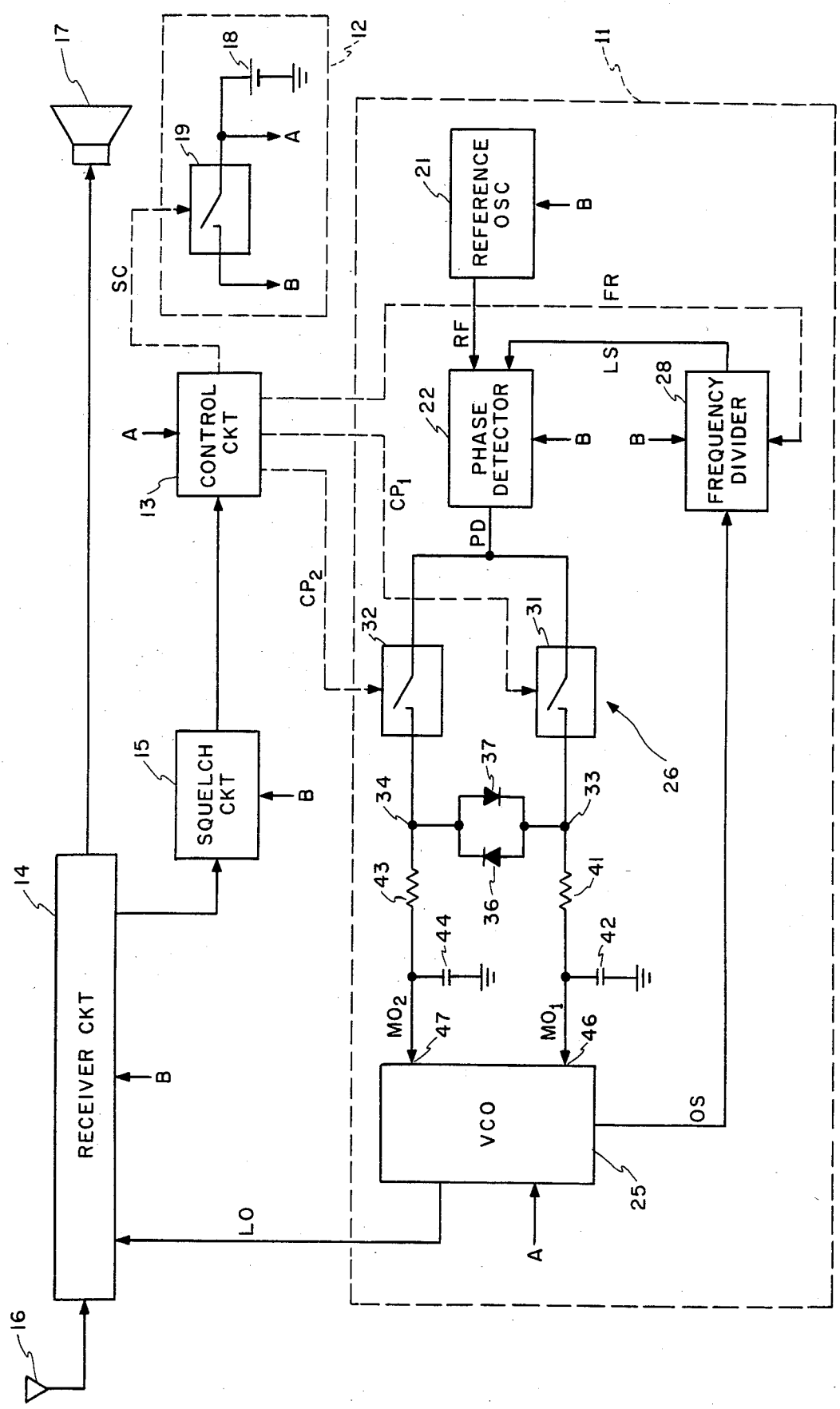
FIG. 1 shows a block diagram of a circuit arrangement according to a preferred embodiment of this invention, together with a receiver circuit and a squelch circuit.

Referring to FIG. 1, a circuit arrangement according to a preferred embodiment of this invention is used as a local oscillator in a portable receiver and comprises a synthesizer 11, a power source circuit 12, and a control circuit 13. The illustrated circuit arrangement is operable in cooperation with a receiver circuit 14 and a squelch circuit 15 both of which are known in the art. The receiver circuit 14 comprises a high frequency amplifier, a mixer, an intermediate frequency amplifier, and a low frequency amplifier. When a desired radio signal is received through an antenna 16, the desired radio signal is sent through the receiver circuit 14 to a loudspeaker 17 and reproduced by the loudspeaker 17 in a well-known manner.

In a waiting or standby state, battery saving operation is carried out in a manner to be described. In FIG. 1, the squelch circuit 15 produces an enable signal indicative of the battery saving operation in the waiting state by monitoring an output signal of the intermediate frequency amplifier. The control circuit 13 carries out control operation necessary for the battery saving operation in response to the enable signal in a manner to be presently described and may be a microprocessor.

The control circuit 13 delivers a source control signal SC to the power source dircuit 12 in response to the enable signal. The power source circuit 12 comprises a battery 18 and a source switch 19 operable in response to the source control signal SC. The battery 18 produces a battery voltage directly as a continuous source voltage A and through the source switch 19 as an intermittent source voltage B.

Figure 2:
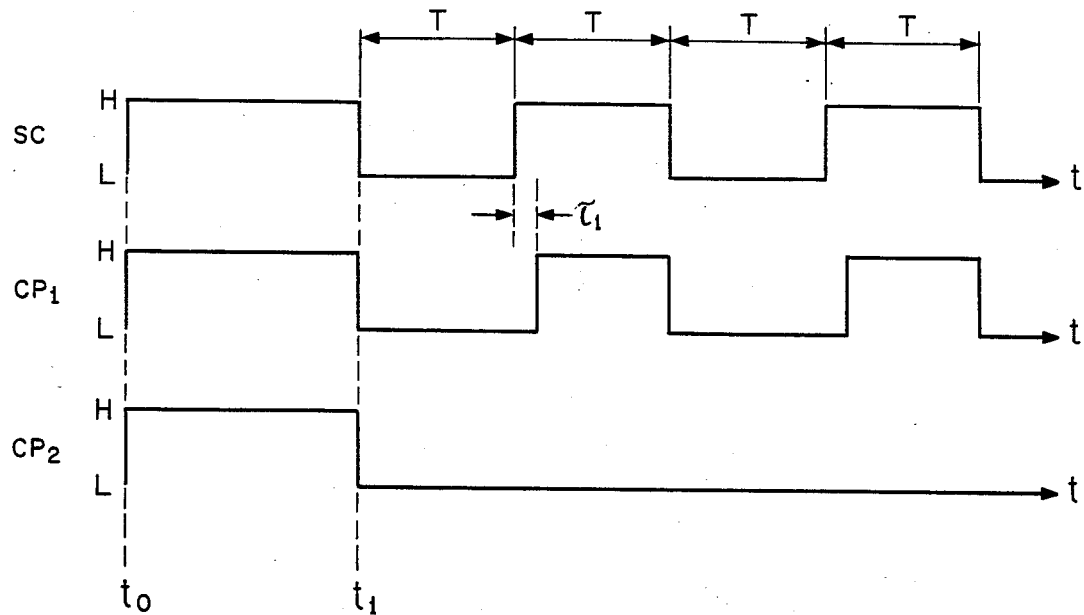
FIG. 2 is a time chart for use in describing operation of the circuit arrangement illustrated in FIG. 1.

Temporarily referring to FIG. 2, the battery saving operation begins at a zeroth time instant $t_0$ at which a power switch (not shown) is turned on. The source control signal SC initially takes a high level H lasting for an initial duration from the zeroth time instant $t_0$ to a first time instant $t_1$. The initial duration may be, for example, one second long. Thereafter, the source control signal SC is turned into a low level L. The low level L lasts for a predetermined interval of time T and is changed to the high level H which lasts the predetermined interval T. Thus, the source control signal SC alternatingly takes the low and the high levels L and H at the predetermined interval T, respectively. The predetermined interval T may be, for example, several tens of milliseconds or so.

In FIG. 1, the source switch 19 is closed and opened during the high level H and the low level L of the source control signal SC, respectively. Accordingly, the intermittent source voltage B intermittently takes the battery voltage and has a waveform similar to that of the source control signal SC illustrated in Fig. 2. The intermittent source voltage B serves to alternatingly define an active and an inactive interval of time which are specified by the high and the low levels H and L of the source control signal SC, respectively.

The illustrated synthesizer 11 comprises a reference oscillator 21 for generating a reference signal RF of a reference frequency and a phase detector 22 for detecting a phase difference between the reference signal RF and a local signal LS to produce a phase difference signal PD of a variable level corresponding to the phase difference. The variable level of the phase difference signal PD is variable relative to a preselected level in a positive and a negative direction. The phase difference signal is sent to a voltage-controlled oscillator (VCO) 25 through an intermediate circuit 26 which will be described later in detail and which is between the phase detector 22 and the voltage-controlled oscillator 25.

The voltage-controlled oscillator 25 delivers an oscillation signal OS of an oscillation frequency to a frequency divider 28. The oscillation signal OS is frequency divided by the frequency divider 28 to be sent to the phase detector 22 as the local signal LS. The oscillation signal OS may be directly sent to the phase detector 22 rather than through the frequency divider 28. The oscillation signal OS is also delivered to the receiver circuit 14 as a local oscillation signal LO to the above-mentioned mixer.

During the battery saving operation, the continuous source voltage A is fed to the control circuit 13 and the voltage-controlled oscillator 25 while the intermittent source voltage B is delivered to the receiver circuit 14, the squelch circuit 15, the reference oscillator 21, the phase detector 22, and the frequency divider 28. This means that the phase difference signal PD intermittently appears during the active interval indicated by the intermittent source voltage B and disappears during the inactive interval. Therefore, the phase difference signal PD inevitably irregularly fluctuates and renders the voltage-controlled oscillator 25 unstable, if such an intermittent phase difference signal PD were supplied direct to the voltage-controlled oscillator 25.

The intermediate circuit 26 is operable to modify the phase difference signal PD into a modified signal which continuously lasts even during the inactive interval. More specifically, the intermediate circuit 26 comprises a first switch 31 and a second switch 32 both of which are supplied with the phase detection signal PD and which are switched by first and second control pulses $CP_1$ and $CP_2$ supplied from the control circuit 13, respectively.

In FIG. 2, the first control pulses $CP_1$ is produced in synchronism with the source control signal SC. Specifically, an initial or first one of the first control pulses $CP_1$ lasts from the zeroth time instant $t_0$ to the first time instant $t_1$ and therefore initially appears simultaneously with an initial pulse of the source control signal SC. Each of the remaining first control pulses $CP_1$ has a leading edge delayed by a time delay $\tau_1$ relative to each pulse of the source control signal SC and a trailing edge coincident with each pulse of the source control signal SC, as illustrated in FIG. 2. The time delay $\tau_1$ is determined in consideration of a rise time of the power source circuit 12 and a stabilization time of the reference oscillator 21.

On the other hand, the second control pulses $CP_2$ solely appears in synchronism with the initial one of the first control pulses $C_{P1}$. This means that the second control pulse $CP_2$ is solely produced during the battery saving operation when the power switch (not shown) is turned on.

The control circuit 13 produces the source control signal SC and the first and the second control pulses $CP_1$ and $CP_2$, as mentioned above. In addition, a factor signal FR is delivered from the control circuit 13 to the frequency divider 28 to indicate a factor of frequency division. The source control signal SC and the first and the second control pulses $CP_1$ and $CP_2$ can be readily generated by a single chip processor or a combination of gates, a delay circuit, flip flops, and the like.

In FIG. 1, the first switch 31 allows the phase difference signal PD to pass therethrough as a first intermediate signal when closed in response to the first control pulses $CP_1$. Likewise, the second switch 32 allows the phase difference signal PD to pass therethrough as a second intermediate signal when closed in response to the second control pulse $CP_2$. The first and the second intermediate signals have a common variable level similar to that of the phase difference signal PD. Anyway, the phase difference signal PD is divided into the first and the second intermediate signals through the first and the second switches 31 and 32. A combination of the first and the second switches 31 and 32 may be referred to as a division circuit for dividing the phase difference signal PD into the first and the second intermediate signals.

The first and the second intermediate signals are produced as the modified signal with division into first and second modified signals $MO_1$ and $MO_2$ in a manner described hereinunder. A bidirectional nonlinear circuit has first and second terminals 33 and 34 connected to the first and the second switches 31 and 32, respectively. The illustrated bidirectional nonlinear circuit has a first diode 36 directed from the first terminal to the second terminal and a second diode 37 connected in a direction opposite to that of the first diode 36. The first and the second diodes 36 and 37 have positive and negative conduction thresholds or transition levels higher and lower than the preselected level of each of the first and the second intermediate signals or the phase difference signal PD, respectively.

The first diode 36 becomes conductive when the variable level of the first intermediate signal varies in the positive direction and exceeds the positive transition level with the second intermediate signal extinct. The second diode 37 becomes conductive when the variable level of the first intermediate signal exceeds the negative transition level with the second intermediate signal extinct.

It is to be noted here that the second intermediate signal never appears but the first intermediate signal appears. As a result, the first and the second diodes 36 and 37 never become conductive in response to the second intermediate signal.

The first terminal 33 is connected to a first low-pass filter comprising a first resistor 41 and a first capacitor 42 while the second terminal 34 is connected to a second low-pass filter comprising a second resistor 43 and a second capacitor 44. Specifically, the first resistor 41 is connected between the first terminal 33 and a first input terminal 46 of the voltage-controlled oscillator 25. The first capacitor 42 is connected between the first input terminal 46 and the ground. Likewise, the second resistor 42 is connected between the second terminal 34 and a second input terminal 47 of the voltage-controlled oscillator 25. The second capacitor 44 is connected between the second input terminal 47 and the ground.

The first low-pass filter is supplied with the first intermediate signal through the first switch 31 to hold the first intermediate signal as a first held signal during the inactive interval in which the first and the second switches 31 and 32 are opened. As a result, the first low-pass filter delivers the first modified signal $MO_1$ as a part of the modified signal to the voltage-controlled oscillator 25. Similarly, the second low-pass filter is initially supplied with the second intermediate signal in timed relation to the second control pulse $CP_2$. In addition, the second low-pass filter is supplied with the conduction signal when the bidirectional nonlinear circuit becomes conductive. Accordingly, the bidirectional nonlinear circuit may be regarded as a part of the second low-pass filter. At any rate, the second low-pass filter supplies the second modified signal $MO_2$ to the second input terminal 47. It is readily understood that the second modified signal $MO_2$ appears when the second intermediate signal is produced in an initial state and the first intermediate signal exceeds the positive and the negative transition levels of the bidirectional nonlinear circuit.

Figure 3:
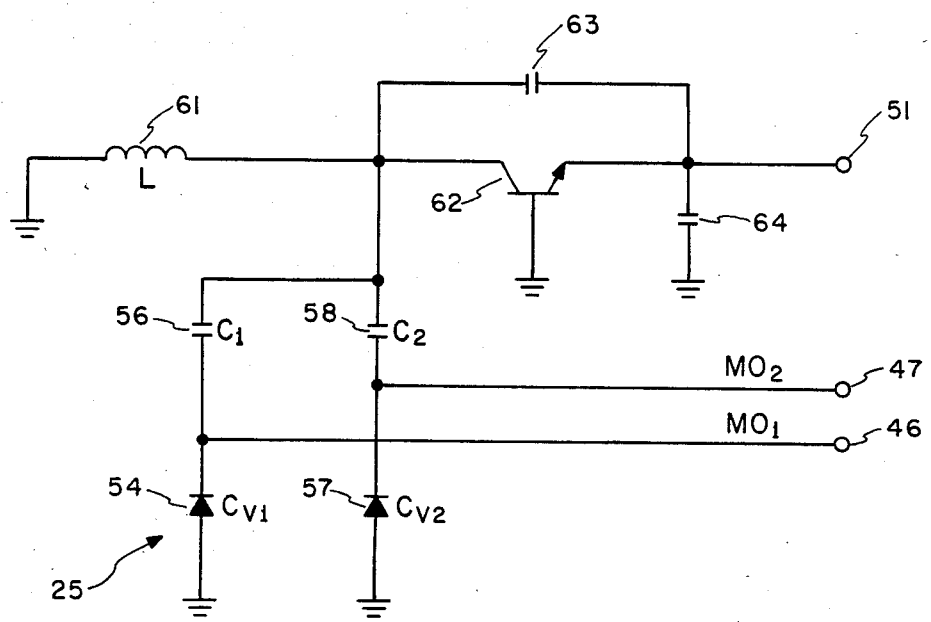
FIG. 3 is a circuit diagram of a voltage-controlled oscillator for use in the circuit arrangement illustrated in FIG. 1.

Referring to FIG. 3 together with FIG. 1, the voltage-controlled oscillator 25 has, in addition to the first and the second input terminals 46 and 47, an output terminal 51 coupled to the receiver circuit 14 and the frequency divider 28. The illustrated voltage-controlled oscillator 25 comprises a first varactor diode 54 of a first variable capacitance $C_{V1}$ and a first capacitor 56 of a first capacitance $C_1$ connected in series to form a first series circuit grounded at one terminal thereof. The first input terminal 46 is connected to a point of connection between the first varactor diode 54 and the first capacitor 56.

A second series circuit comprises a second varactor diode 57 of a second variable capacitance $C_{V2}$ and a second capacitor 58 of a second capacitance $C_2$ and is connected in parallel to the first series circuit. The second input terminal 47 is connected to another point of connection between the second varactor diode 57 and the second capacitor 58.

A combination of the first and the second series circuits will be called a parallel circuit hereinunder. Each of the first and the second variable capacitances $C_{V1}$ and $C_{V2}$ is variable in dependency upon each level, namely, each voltage V of the first and the second modified signals $MO_1$ and $MO_2$. Each variable capacitance $C_V$ (suffix omitted) is given by:

$$C_V = KV^{-r}, \qquad (1)$$

where K is representative of a constant and r, another constant determined by a junction formed in each varactor diode.

It is assumed that the first and the second series circuits have first and second partial capacitances $C_{P1}$ and $C_{P2}$ which are varied in accordance with the levels of the first and the second modified signals $MO_1$ and $MO_2$, respectively, and that the parallel circuit has a total capacitance $C_t$ equal to a sum of the first and the second partial capacitances $C_{P1}$ and $C_{P2}$. In the interim, it is to be recollected that the second modified signal $MO_2$ appears simultaneously with the first modified signal $MO_1$, although the first modified signal $MO_1$ can solely appear. Sole appearance of the first modified signal $MO_1$ causes the total capacitance $C_t$ to vary at a first rate dependent on variation of the first variable capacitance $C_{V1}$. On the other hand, appearance of both of the first and the second modified signals $MO_1$ and $MO_2$ causes the total capacitance Ct to vary at a second rate dependent on variation of both of the first and the second variable capacitances $C_{V1}$ and $C_{V2}$.

As intuitively understood from FIG. 3, the first rate is slower than the second rate. Thus, the parallel circuit is operable to provide first and second circuit constants which are first and second ones of the total capacitances $C_t$ specified by the first and the second rates, respectively. The parallel circuit may therefore be referred to as a circuit constant providing circuit.

An oscillator circuit is connected to the parallel circuit and comprises an inductor 61 of an inductance L, an NPN transistor 62, and first and second oscillation capacitors 63 and 64 which are connected between an emitter and a collector of the transistor 62 and between the emitter and a base thereof, respectively. The continuous source voltage A (FIG. 1) is supplied to a bias circuit attached to the transistor 62. The bias circuit is well known in the art and is therefore omitted from FIGS. 1 and 3. Accordingly, the oscillator circuit is always energized by the continuous source voltage A.

Figure 4:
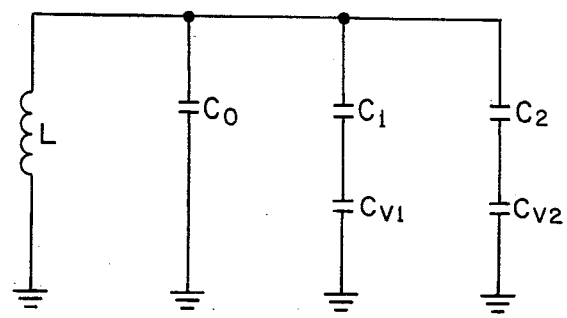
FIG. 4 shows an equivalent circuit of the voltage-controlled oscillator illustrated in FIG. 3.

Referring to FIG. 4, the voltage-controlled oscillator 25 is shown by an equivalent circuit comprising the inductance L and capacitances $C_1$, $C_{V1}$, $C_2$, $C_{V2}$, and $C_0$. The capacitance $C_0$ is an equivalent capacitance of the transistor 62 and the capacitors 63 and 64. The voltage-controlled oscillator 25 has an oscillation frequency f which is given by:

$$f = \tfrac{1}{2}\pi(L(C_0 + C_t))^{\frac{1}{2}}, \qquad (2)$$

where $C_t$ is representative of the total capacitance of the parallel circuit comprising the first and the second variable capacitances $C_{V1}$ and $C_{V2}$ and the first and the second capacitances $C_1$ and $C_2$.

As is obvious from Equation (1), the total capacitance $C_t$ is variable at the first and the second rates in dependency upon each voltage V of the first and the second modified signals $MO_1$ and $MO_2$. For example, it will be assumed that at least one of the first and the second modified signals is changed from a reference voltage $V_0$ by $\Delta V$ and that the resultant voltage $(V_0+\Delta V)$ causes the total capacitance $C_t$ to vary from a reference capacity $C_{t0}$ by $\Delta C$ in accordance with Equation (1). As a result, the oscillation frequency f is assumed to be deviated from a preselected frequency $f_0$ by $\Delta f$. Under the circumstances, a sensitivity of the voltage-controlled oscillator 25 is defined by:

$$\Delta f/\Delta V. \tag{3}$$

From Equations (2) and (3), it is readily understood that the sensitivity becomes high as a variation $\Delta C$ of the total capacitance $C_t$ increases. This means that the voltage-controlled oscillator 25 illustrated in FIG. 3 is operable with high sensitivity on reception of both of the first and the second modified signals $MO_1$ and $MO_2$ and is operable with a low sensitivity on sole reception of the first modified signal $MO_1$. The high sensitivity of the voltage-controlled oscillator 25 serves to rapidly put the synthesizer 11 (FIG. 1) into a locked state but often makes operation of the synthesizer 11 unstable. On the other hand, the low sensitivity makes a response time of the synthesizer 11 long but serves to stably operate the synthesizer 11.

Thus, the illustrated voltage-controlled oscillator 25 initially produces the oscillation signal OS with the high sensitivity in response to both of the first and the second modified signals $MO_1$ and $MO_2$. Thereafter, the oscillation signal is produced with a high stability in response to the first modified signal $MO_1$. Anyway, the oscillation frequency is decided by either one of the first and the second ones of the circuit constants, namely, total capacitance.

In FIG. 1, the squelch circuit 15 will stop the enable signal to indicate interruption of the battery saving operation in due course. In this event, the source switch 19 and the first switch 31 are continuously put in closed states, respectively. Accordingly, the intermittent source voltage B is turned into a continuous source voltage similar to the voltage A and the phase difference signal PD is continuously sent through the first switch 31 to the voltage-controlled oscillator 25.

Figure 5:
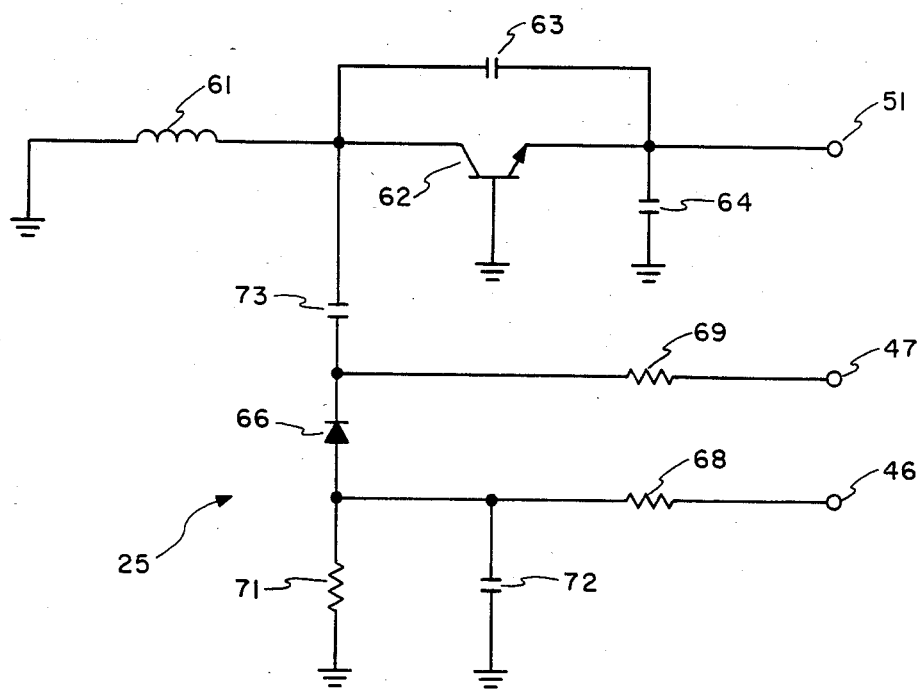
FIG. 5 is a circuit diagram of another voltage-controlled oscillator applicable to the circuit arrangement illustrated in FIG. 1.

Referring to FIG. 5, a voltage-controlled oscillator 25 is also applicable to the synthesizer 11 illustrated in FIG. 1 and comprises similar parts designated by like reference numerals. In FIG. 5, the voltage-controlled oscillator 25 comprises, as the circuit constant providing circuit, a single varactor diode 66 having an anode and a cathode connected to the first and the second input terminals 46 and 47 through resistors 68 and 69, respectively. The anode of the varactor diode 66 is grounded through a parallel circuit of a resistor 71 and a capacitor 72 while the cathode of the varactor diode 66 is connected to the collector of the transistor 62 through a coupling capacitor 73.

With this structure, a variable capacitance of the varactor diode 66 is varied in a manner similar to the oscillator 25 illustrated in FIG. 3. Specifically, the variable capacitance is varied with a predetermined rate on reception of the first and the second modified signals $MO_1$ and $MO_2$ and with a slower rate on sole reception of the first modified signal $MO_1$.

Like in FIG. 3, the illustrated oscillator 25 also has two different sensitivities. The oscillator frequency of the oscillation signal is varied with the different sensitivities.

While this invention has thus far been described in conjunction with a preferred embodiment thereof, it will readily be possible for those skilled in the art to put this invention into practice in various other manners. For example, two of the circuit constants may be selectively switched from one to another in response to the respective modified signals $MO_1$ and $MO_2$ and may be inductances. The circuit constants may be varied in a time division fashion. In addition, the circuit arrangement may be also used in a transmitter to oscillate a local frequency signal.

What is claimed is:

1. In a circuit arrangement comprising, for carrying out a battery saving operation, voltage producing means for producing during said battery saving operation a continuous and an intermittent source voltage with said intermittent source voltage made to alternatingly define an active and an inactive interval, phase difference detecting means energized during said active interval for detecting a phase difference between a reference and a local signal to produce a phase difference signal of a variable level corresponding to said phase difference, signal modifying means for modifying said phase difference signal into a modified signal which lasts continuously even during said inactive interval, oscillation generating means energized by said continuous source voltage and responsive to said modified signal for generating an oscillation signal of an oscillation frequency dependent on said modified signal, and supplying means for supplying said phase difference detecting means with said oscillation signal as said local signal, the improvement wherein:

said signal modifying means comprises:
signal dividing means energized during said active interval for dividing said phase difference signal into a first and a second intermediate signal which have said variable level in common; and
signal producing means responsive to said first and said second intermediate signals for producing said modified signal with division into a first and a second modified signal;
said oscillation generating means comprising:
circuit constant providing means having a first and a second circuit constant and responsive to said first and said second modified signals for providing said first and said second circuit constants, respectively; and
an oscillator energized by said continuous source voltage and coupled to said circuit constant providing means for generating said oscillation signal with said oscillation frequency decided by one of said first and said second time constants.

2. A circuit arrangement as claimed in claim 1, further comprising:
control means operable during said battery saving operation for producing a succession of first control pulses and an isolated second control pulse, said first and said second control pulses appearing in synchronism with said active and said inactive intervals and with a specific one of said first control pulses, respectively;
said signal dividing means comprising:

first means responsive to said first control pulses for producing said phase difference signal as said first intermediate signal; and second means responsive to said second control pulse for producing said phase difference signal as said second intermediate signal.

3. A circuit arrangement as claimed in claim 2, the variable level of said phase difference signal being variable in a positive and a negative direction relative to a preselected level, wherein said signal producing means comprises:

a bidirectional nonlinear circuit having a positive and a negative conduction threshold and connected to said first and said second means, said bidirectional nonlinear circuit being put into a conductive state to produce a conduction signal each time when the variable level of said phase difference signal varies in said positive and said negative directions to exceed said positive and said negative conduction thresholds, respectively, said bidirectional nonlinear circuit being otherwise put in a nonconductive state;

first holding means connected to said bidirectional nonlinear circuit for holding said first intermediate signal as a first held signal during said inactive interval and during said nonconductive state to produce said first held signal as said first modified signal; and second holding means connected to said bidirectional nonlinear circuit for holding said second intermediate signal and said conduction signal collectively as a second held signal during said inactive interval and during said conductive state to produce said second held signal as said second modified signal.

* * * * *